United States Patent [19]

Sutherland

[11] Patent Number: 5,684,724
[45] Date of Patent: Nov. 4, 1997

[54] FLASHBACK SIMULATOR

[75] Inventor: Ivan E. Sutherland, Santa Monica, Calif.

[73] Assignee: Sun Microsystems, Inc., Mountain View, Calif.

[21] Appl. No.: 521,478

[22] Filed: Aug. 30, 1995

[51] Int. Cl.$^6$ ............................................. G06F 9/455
[52] U.S. Cl. ...................................... 364/578; 364/488
[58] Field of Search ............................ 364/578, 488; 395/500, 183.09, 920

[56] References Cited

U.S. PATENT DOCUMENTS

| | | | |
|---|---|---|---|
| 4,901,260 | 2/1990 | Lubachevsky | 364/578 |
| 5,157,620 | 10/1992 | Shaar | 364/578 |
| 5,272,651 | 12/1993 | Bush et al. | 364/578 |
| 5,307,479 | 4/1994 | Ulrich et al. | 395/500 |
| 5,375,074 | 12/1994 | Greenberg et al. | 364/578 |
| 5,442,772 | 8/1995 | Childs et al. | 395/500 |
| 5,550,760 | 8/1996 | Razdan et al. | 364/578 |

OTHER PUBLICATIONS

Blaauw et al., "Reducing the Scheduling Cost in Event-Driven Simulation Through Component Clustering," 1993 European DAC, pp. 18–22.

Yu et al., "A Provably Correct, Non-Deadlocking Parallel Event Simulation Algorithm," 1991 Simulation Symposium, pp. 100–111.

*Primary Examiner*—Kevin J. Teska
*Assistant Examiner*—Leigh Marie Garbowski
*Attorney, Agent, or Firm*—Townsend and Townsend and Crew LLP

[57] ABSTRACT

A simulator is described in which the simulator can flashback to simulate events that in simulated time actually occurred earlier than other events already simulated. The simulator removes the restriction of a monotonic relationship between simulation time and simulated time, enabling improved simulator performance.

8 Claims, 1 Drawing Sheet

FLASHBACK SIMULATOR

BACKGROUND OF THE INVENTION

Numerous computer programs are now well known which can simulate the behavior of various systems. Simulators are known for use in simulating chemical or other process operations, transportation systems, aerodynamic behavior, electronic circuits and other phenomena. For example, one simulator for electronic circuits is known as Spice. Spice is a computer program designed to provide a simulation of circuit operation. In a Spice simulator, a complete representation of a circuit in mathematical form is provided, as well as information regarding all input signals. The effect of these input signals applied to the described circuit is then calculated repeatedly at desired time intervals. Importantly, the calculations are performed on the described circuit in a chronological manner. That is, beginning at a first instant in time, the effect of the input signals upon the circuit elements is calculated over a short interval. This interval, referred to as simulation time, corresponds to a short period of time of actual circuit operation.

The simulator "clock" is then advanced and the simulation calculations repeated, providing a description of circuit operation at a later time. The repeated calculations provide information about the behavior of the circuit at this slightly later instant in simulation time. As a result, the behavior of the entire circuit at this next instant of time will be simulated. This process is repeated over and over again until the performance of the entire simulated circuit over a desired time interval has been determined. This same chronological process is used in the other simulators described above.

Simulators that behave in this manner have certain limits. Essentially the behavior of the entire circuit or system must be calculated on an instant by instant basis. All calculations are done in time sequence. The behavior of every node in the circuit or every aspect of the system is calculated for every instant sequentially. For large or complicated circuits this can be extraordinarily slow, requiring hours of computer time, in part because the state of all nodes and elements must be completely determined before the simulator clock can be advanced. One example of a typical Spice simulator is PSpice, a derivative of the University of California at Berkeley version of Spice from MicroSim Corporation. Logic simulators are also well known. In these simulators a logical design is simulated to verify that the design, when built, will function as intended. See, for example, the Quick Sire II logic simulator from Mentor Graphics Corporation.

SUMMARY OF THE INVENTION

For this invention, simulation time and simulated time are distinguished. "Simulation" time herein refers to the time at which the simulator actually performs an operation. "Simulated" time refers to the time at which the simulated events would have occurred in the world being simulated. Because the simulator is a real system in the real world, simulation time advances with real time; simulated time can be treated more freely, however, as described here.

A simulator for certain types of systems or circuits can partly ignore the strict order of stimulated time. It can simulate events that in simulated time actually occurred earlier. In simulating any one of several concurrent paths, the simulator can proceed along a particular path even if some other path, in reality, would have acted first. By loosening the relationship between simulation time and simulated time, simulator performance is improved. This is made possible by a reduction in the number of instances where the simulator must refer to its event queue.

In prior art simulators, simulated time and simulation time were related monotonically. In the simulator described here, there is no need for this relationship. The simulator may simulate one set of concurrent events further forward in simulated time than those on some other concurrent path. Because simulation time and simulated time are decoupled, events may be simulated in an order different than the order in which they would naturally occur. Because this concept, when used in motion pictures, is known as a flashback, the simulator of this invention is referred to herein as a flashback simulator.

In a preferred embodiment of this invention, the simulator is used for electrical circuits and provides a method for simulating behavior of an electrical circuit design. The method includes the steps of providing a representation of an electrical circuit to be simulated, which representation includes interconnected first elements, circuit paths and circuit elements. Next, a step is performed of determining the electrical behavior of a first portion of the circuit prior to a first element by calculating electrical parameters relating the first portion of the circuit. These electrical parameters include determining the simulated time of arrival of a first signal at the first element.

Following that step, the electrical behavior of a second portion of the circuit, which does not include the first element, is also determined. For this second portion of the circuit, the electrical parameters are also calculated which include the simulated time of arrival of a second signal at the first element. The simulated time of arrival of the first signal is calculated before the simulated time of arrival of the second signal, but the simulated time of arrival of the second signal may be prior to the simulated time of arrival of the first signal.

DESCRIPTION OF THE SPECIFIC EMBODIMENT

Figure 1:
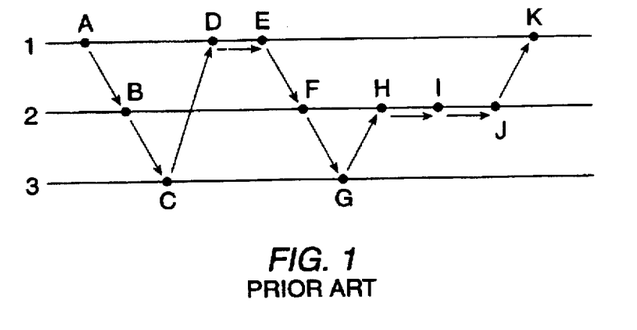
FIG. 1 is a diagram illustrating the operation of a prior art simulator.

FIG. 1 is a diagram illustrating the operation of a prior art simulator. The three horizontal lines can be considered to represent three nodes in a circuit to be simulated, or three time lines in a system. Events occur at the points designated by letters. For example, on paths 1, 2, and 3 events A through K occur, with different events on different paths. The events occur in letter sequence, that is, A, B, C, ..., K.

In prior art simulators, simulation will proceed along a first path for a short interval, then along a second path for a short interval, etc. The interval will be short enough to prevent more than an event on each path from being simulated. Eventually event A will be simulated. The simulator will continue its operation, eventually simulating event B, then event C, etc. Ultimately, events A through K will be simulated and the simulator will complete its task. Note that in FIG. 1 the simulator will have changed paths for the simulation event every time except between events D and E, and among events H, I and J. In reality, however, the simulator will have changed paths hundreds of times. This is because it is necessary for the simulator to simulate along each path for a very short time compared to the occurrence of events. Because the simulator has no knowledge of when event E will occur, it must simulate along each path in short increments after event D to be sure that the next event does not occur along some other path. Such a simulator is clearly quite inefficient.

Figure 2:
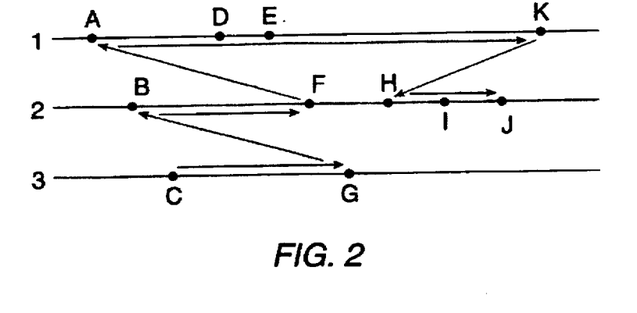
FIG. 2 is a diagram illustrating the contrasting operation of this simulator.

FIG. 2 is a diagram similar to FIG. 1 illustrating a simulation operation according to this invention. The properties of many circuits, or other systems, which are event driven, insensitive to delay, or otherwise calculable, allow a simulator to compute the simulated time of various events out of order. In other words, an event which occurs in the real circuit later than an earlier event can be simulated before the earlier event, rather than after it, as would normally be the case. As will be described, this provides unique advantages.

As shown in FIG. 2, the simulator of this invention operates in a different manner. The simulator can proceed along a path as long as desired (as described further below) then switch to another path, even if events on that other path occurred earlier in time than those on the first path simulated. Using the same events as in FIG. 1, the simulator may begin simulation on path 3 and simulate all events on that path. It can then "flashback" to simulate the earlier occurring events B and F on path 2, then flashback again to simulate events A, D, E and then K. After simulating event K, events H, I and J can be simulated. As shown, the simulation is independent of the actual order of events.

In another commonly assigned patent application, circuits are described having certain properties which are well suited for being simulated using this invention. See, for example, U.S. patent application Ser. No. 08/333,554, filed Nov. 2, 1994, and entitled "Three Conductor Asynchronous Signaling," which describes event driven circuits. In event logic no clock signal is required. The logic includes elements which act when events occur. One delay insensitive circuit described in that patent application is a specific hardware element known as a rendezvous element.

Figure 3:
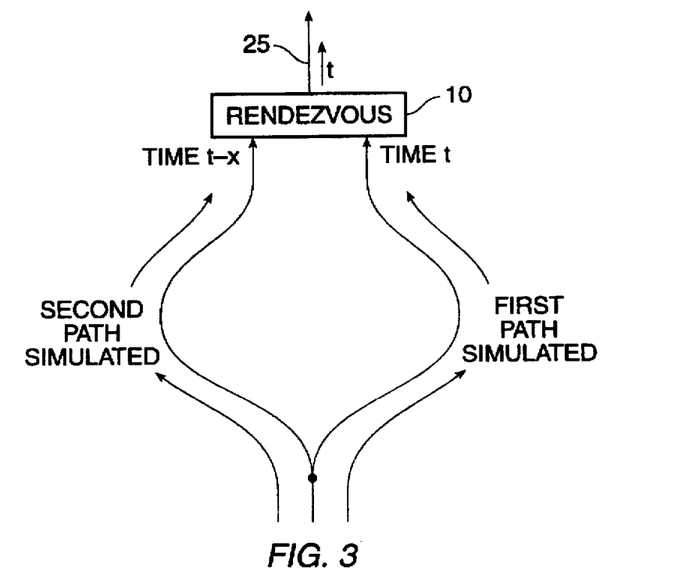
FIG. 3 is another diagram illustrating the simulator operation.

FIG. 3 illustrates a rendezvous element 10. A rendezvous element is often provided where the paths of two concurrent events join. Paths 15 and 20 in FIG. 3 represent the paths of events prior to the rendezvous element 10. The rendezvous element waits until the last of its input terminals has received an event. Then, and only then, does the rendezvous element create an event at its output terminal 25. Rendezvous elements are required in delay insensitive circuits because one or more of their input signals might be arbitrarily delayed. This property of delay insensitive circuits enables the flashback simulator of this invention to provide an additional benefit. The simulator can simulate any of a set of concurrent paths in any simulation time order. For example, the simulator may simulate one path 15 until it reaches the input of the rendezvous element 10 or other desired element. The simulator then can simulate the next path 20. It need not determine which path will react first to an input signal.

In the case of rendezvous elements, when the simulator has simulated the state of the circuit up to an input to a rendezvous element, there are two possibilities. In a first case, the simulator may not yet have simulated the other paths up to the rendezvous element. For example, for the first path 15 simulated, the rendezvous element is expected to receive an input signal at time t. The second path 20 has not been simulated at this time. In this case the simulator can work on path 20, or some other task. In the second case, the simulator has simulated the other paths up to the other input terminals of the rendezvous element; therefore, it may immediately simulate the output signal of the rendezvous element, and then continue along the resulting activities. This second case is illustrated by path 20, the second path simulated. By this point the first path 15 simulation has been completed.

If the simulator is intended to reveal the speed of real circuit, it maintains a record of simulated time as it computes the various events on each path. At each input to a rendezvous element it records the simulated time at which the event arrived. In the case of FIG. 3, path 15 arrives at time t, and path 20 arrives at t-x. It need not record these simulated times in simulated time order. For example, as described above, it may have computed the effects of a later arriving path 15 before computing the effects of an earlier arriving path 20.

Eventually the simulator will have recorded times for signals at each of the input nodes of the rendezvous element. It is then possible to simulate the output signal of the rendezvous element. In the case of FIG. 3 path 15 arrived last. The output time for a rendezvous element is the largest simulated time recorded at each of the inputs, because the simulated time at which the rendezvous element triggers is the latest of the arrival times of the signals at its inputs. As described, the simulator may have recorded the simulated times out of simulated time order.

By changing context less frequently, a faster simulator, and therefore faster simulation, is made possible. Thus, when the simulator reaches one input terminal of a rendezvous element, it can check the other input terminals to see if the simulation for all the other terminals has been completed. If they all have been completed, the simulator can proceed with simulating the output path. It may be necessary, however, to reset simulated time. The simulator will reset simulated time if one of the other input signals has a recorded simulated time later than the simulated time the simulator just computed for the final comparison of computation input dam. (The final input data reference is the one with greatest simulation time, not the one with the last simulated time input, even if other computational chores have delayed the simulator for an expendable period of simulation time.)

In prior work, we described circuit elements known as fork, toggle, merge and call. Simulation of these elements is described below. A fork in the path of simulation can be treated as placing two events on the event queue. Alternatively and preferably, the simulator can proceed with simulating the paths in succession in any order, and place only the other path upon the event queue to be worked on later.

A toggle is an element whose output signal switches from one node to the next with each subsequent input signal. The toggle element can be simulated as a simple delay in the path whose output is taken. Thus, upon reaching a toggle, the flashback simulator determines which output path to take, adds the proper delay, then proceeds.

Another delay insensitive component is merge. The merge element produces an output signal after it receives an input signal on either of its input terminals. A merge element has more than one input, but requires its environment to guarantee that these inputs are never used concurrently. Elements, such as merge, provide the flashback simulator with the opportunity to check its own operation as well as the delay insensitivity of the circuit being simulated. The flashback simulator can record the simulated time at which any input to a merge element arrives. If, later in simulation time, the simulator computes a simulated arrival time earlier than the recorded time, then an error has occurred. There are two cases where this error might occur: between references to the event queue, or separated by one or more references to the event queue.

First, consider the case that the offending events occur between references to the event queue. The simulator can simulate the same merge element many times between references to the event queue. The output signal from the merge might drive a toggle element. That toggle element, in turn, could drive the other input to the merge element. Each such pass through the merge element between references to the event queue must be at a later simulated time because flashbacks occur only on reference to the event queue. Thus, in such circumstances, computing a simulated arrival time earlier than the record time indicates an error in the simulator.

Next, consider the case that the offending events are separated by one or more references to the event queue. In this case the simulator may have flashed back to compute a separate concurrent path that is earlier in simulated time than the path already computed. Thus, computing a simulated arrival time earlier than the recorded time may indicate a circuit error. Such an error could be produced if the circuit called for concurrent paths to use the same merge element. Of course, this is not permitted for a merge element. Thus, in both cases the simulator should compute the input events for the merge in the same order in which they would occur in simulated time.

Two other circuit elements which require care in simulation using this invention are selectors and arbiters. A selector circuit passes its input event onto a chosen output terminal under control of data supplied to the selector. The selector is different from other elements because it requires its data input signal to have arrived before, in simulated time, its control input signal can test the data value. Because its output signal is not computable until its data input signals and its control input signals are known, it is like the rendezvous element. As a result, in the simulator described here, work is postponed on the selector output signal until there are no earlier events on the event queue. This is one of the user requirements imposed on sorting the event queue.

The second element requiring care is an arbiter. An arbiter monitors the state of its multiple input terminals and determines the order in which they receive signals. The simulator may compute the concurrent input signals to an arbiter out of simulated time sequence. Unfortunately, however, arbiters often respond to a single input signal; any other input signal may never arrive. Therefore, the simulator cannot wait for all input signals to arrive before computing any output signal.

The simulator may correctly compute the output signal of an arbiter based on only a single input signal time. As a result, the simulation of such elements requires that the simulator work through all of the events on the event queue that are earlier in simulated time than the arrival time of an arbiter input signal, before the simulator computes the output signal of the arbiter.

The flashback simulator of this invention is faster than a simulator that insists on strict ordering between simulated and simulation time. This is made possible because the flashback simulator refers less frequently to the event queue. Additionally, it is not necessary to sort the event queue. The only requirement for the event queue is that it be divided into elements earlier than, and later than, certain critical events. These critical events are the input events to selectors and arbiters.

Several approaches enable a partially ordered event list to be provided. For example, a tree structure can be used where the critical events are branch points in the tree, and the non-critical events remain as unsorted sets. Another approach is to keep the event queue as a simple list in which only critical events are actually stored. Other events appear in the proper interval between the critical events, but are otherwise unsorted.

Because the flashback simulator refers to the event queue infrequently, the computer's program counter may be used to track the position of simulation in the network. A string of events to be simulated in sequence, therefore, is compiled as straight through simulation code. This enables the code to perform the required combinations, and enables it to compute and accumulate the simulated time delay for each operation. At the end of such a string the simulator will have a simulated completion time.

The string can include branches. At each such branch point the simulator can add an event representing one path to the event queue and proceed directly down the other path. Furthermore, it does not matter which side of the branch the simulator follows as straight through code and which side it places in the event queue to be simulated later.

Although the foregoing invention has been described in some detail by way of illustration and example, for purposes of clarity of understanding, it will be obvious that certain changes and modifications may be practiced within the scope of the appended claims.

APPENDIX

Example of Flashback Simulator Encoding

There are three phases of using the simulator of this invention: compile time, setup time and run time. At compile time the types of components and cables available for use in simulation are defined. Typical components are various types of stages, processors, memories, etc. Many C++ classes such as Muller C elements, arbiters, interfaces, etc., are used inside components, but are not themselves components in this sense. The cables between components are defined by the interface classes and represented in the simulation by pointers between components. At compile time the names and the functions of the delays in various parts of the components are defined, but their values remain unspecified.

At setup time, the simulation code reads a file selecting the components for a particular simulation and defining their connections. The file also defines the values of the delays in each component so that simulation runs with slow or fast acting pipelines are possible without recompiling the simulator code. Similarly, at setup time the simulation code can assemble a longer or shorter pipeline or reorder stages in the pipe.

At run time, the simulator as thus defined processes a specific instruction trace. The output from such a run is a collection of statistics about the simulated operation and a journal of selected events.

The simulator is divided into three kinds of classes: service classes, data classes, and component classes. The service classes are generally useful in event driven simulation. The data classes define the data types that move through the simulator. The component classes define the parts of a simulator.

First described below are service classes such as Event, Time and Box. Class Event manages an event queue for the simulator. The event queue is sorted in order of simulated time. A numeric type, Time, provides sufficient precision to represent time throughout a simulation. The simulator operates by removing the earliest event from the event queue and doing the action it specifies. Some such actions put additional events on the event queue. A private variable called doingTime in class Event holds the absolute time of the event that initiated the action currently under way.

The programs for each action have no need to know about absolute time. Their actions are independent of when they take place. Instead, the programs for each action accumulate delay values using a numeric type called Delay. Delays are increments of Time.

The absolute time of an event is the sum of the Time variable doingTime and an accumulated Delay value. To put a new Event on the event queue, the simulator delivers an accumulated delay to the Event class. Class Event does the sum required to compute the absolute time of the new Event and puts the new Event in its proper place in the event queue.

For those cases that must have absolute time, there is a static procedure in class Event. It has the form Time, GetTime(DELAY) returning the absolute time represented by a given delay, considering the present time frame. A matching static procedure in class Event of the form Delay GetDelay(TIME) returns the delay required to represent some future absolute time in the present reference frame of simulated time.

The simulator uses an event queue managed by class Event. Objects with procedures to be called by the event queue are subclasses of class QueueAble. The class Arbiter, for example, is QueueAble. The event queue keeps a journal of marked events. Each event marked for entry into the journal is written to a journal file in the order it occurs in simulated time. This file is suitable for later display or analysis of pipeline behavior.

Class Box is the base class for simulated components. It is the basis of topological connections. It has some knowledge of the parent child relationship used to build a hierarchical of Boxes. It omits sibling pointers. Subclasses of class Box form components.

To illustrate the invention further, the class MullerCC is described in more detail. Each instance of this class simulates the actions of a zero-delay two-input Muller C-element. It has two input routines, called DingA and DingB, which return a positive or zero delay only if the instance has fired, but negative otherwise. The user must model any delay in the Muller C-element. An instance of MullerCC will record the delays it is given and report them when it fires. When it fires, it returns a delay number that properly includes the delay of waiting for the other input.

MullerCC can model a Muller C-element with an inverted B input. Calling new MullerCC (name, False); installs such an inverter permanently. Alternately, calling MasterClear (False) has a similar, but impermanent, effect. It leaves the MullerCC ready to fire after a single ding on its A input for just this one time. In each case the False argument defaults to True if omitted, modeling a Muller C-element with true inputs and output.

Class MullerCC sends error input to cerr if either input is called twice in succession. Unlike a real Muller C-element, it ignores the erroneous second input event. An inverted input B, if any, counts as having been called at the time of Master Clear. Each instance of MullerCC collects and can print statistics recording how many times it fired and how long each input spent waiting for the other. The code for class MullerCC operates without recourse to the event list.

Although class MullerCC avoids putting Events on the event queue, it requires knowledge of absolute simulated time. The reason is that the two inputs of the Muller C-element may see simulator order and simulated time differently. In simulator order, the simulator will call on the inputs in the order that the calling programs came off the vent queue. In simulated time, however, that order may appear to be reversed. The one first called in simulator order may have accumulated a sufficiently large delay value to represent a simulated time later than the one called second in simulator order.

There is, however, an important constraint. It is equally true in both simulator order and simulated time that the simulator must trigger both input signals before getting any output signal. It follows from this constraint that the output signal will occur no earlier in either simulator order or simulated time than the later of the two inputs. Thus, whenever an output occurs, the simulator can represent it as a delay based on the start of the present sequence of simulation actions.

This permits the class MullerCC to avoid adding Events to the event queue. Instead, each instance of MullerCC remembers the absolute arrival time for the input that arrived first in simulator order. It gets the absolute arrival time by calling GetTime in class Event with the accumulated delay. When, in the order of simulation, a second input arrives, the instance of MullerCC gets its absolute arrival time also. By comparing the absolute simulated arrival times of its two inputs, the instance of MullerCC can decide which was later in simulated time even when simulator order differs from simulated time. The instance then represents the later simulated time with respect to the simulated time frame of the input that arrived later in simulation order, using GetDelay in class Event to do the computation.

Because it does not change the time frame, MullerCC may appear to delay one of its inputs. The input arriving later in simulation order will see such a delay if the one arriving earlier in simulator order was later in simulated time. This delay correctly reports the delay until the arrival time of the input later in simulated time even if it was recorded earlier in simulation order.

Class MullerCC has only two working calls, DingA and DingB. Both of these take Delay input parameter and return a Delay output value. A positive of zero Delay return value from DingA or DingB indicates that the Muller C-element fired. The return value is also meaningful; it carries the accumulated Delay contributed by both inputs collectively. The Delay return value will never be less than the Delay input parameter but may be more depending on the simulated arrival time of the other input. An increase in value represents a wait for the other input which was simulated earlier but came later in simulated time.

A negative Delay return value from DingA or DingB indicates that the Muller C element failed to fire. This happens normally for the first input call after a previous firing. This normal negative return is −1. Alternatively, it may indicate an error, already reported on cerr, if DingA or DingB have been called twice in succession. The error negative return is −2.

Internally, the program stores the absolute Time of each arrival, holding the signs of these values negative for inputs that have not yet arrived. When both are positive, it fires and resets both back to negative values. It gets the absolute time with help from two Event class procedures. The static procedure GetTime in class Event takes a Delay as input and returns the absolute Time represented by that delay against the current absolute time frame. A call to GetTime (0) returns the absolute time now being simulated. The static procedure Delay GetDelay (Time) in class Event takes a Time as input and returns the corresponding Delay as seen in the current time reference frame.

Instances of class MullerCC collect statistics about their actions. Private internal variables hold these values. NumFirings holds the number of times the instance fired. WaitTimeA and WaitTimeB hold the total elapsed time that each of the inputs has spent waiting for the other before the instance could fire. If both inputs always arrive at the same time, both of these variables will remain zero.

MullerCC simulates a Muller C-element with zero delay. The instance of MasterCC accepts a delay number at each of its inputs and delivers an accumulated delay number at its output. The output delay number faithfully represents the simulated time of the later, in simulated time, of the two arriving inputs. MullerCC makes no contribution for its own delay.

Users who wish to simulate delay in the Muller C-element itself must do so externally. It is often easiest to add the Muller C-element delay to both input delay numbers before calling DingA or DingB. The addition will appear near both of the calls to DingA and DingB because either may respond when the MullerCC fires.

Below are three examples. Notice that all of these examples destroy the delay value, d, if the MullerCC fails to fire.

```
/* example number one */
MullerCC* M = new MullerCC("tryit");
DELAY d;
d = M- > DingB (d + MullercDelay);
if (d < 0) return;
/* MullerCC fired if we get here at all */
next code statement;
/* example number two */
MullerCC* M = new MullerCC("tryit");
DELAY d;
d = M- > DingB(d + MullercDelay);
if (0 < d) DoAction( );
else return;
* example number three */
MullerCC* M = new Muller("tryit")
DELAY d;
if ((d = M- > DingB (d + MullercDelay)(< 0) return;
/* MullerCC fired if we get here at all */
next code statement;
```

The following is a source listing for the class MullerCC as described above. This is provided as an example.

```
#ifndef MULLERCC_H
#define MULLERCC_H
#include "verbal.h"
class ostream:
class MullerCC : public Verbal
{
  public:
    MullerCC(int TF= True);                /* the constructor, False= bubble on B * /
    MullerCC(char* name int TF= True);     /* the constructor, False= bubble on B * /
    virtual void Master Clear(int TF= True); /* False puts bubble on input B */
    virtual DELAY DingA(DELAY d);          /* returns positive delay if it fires * /
    virtual DELAY DingB(DELAY d);          /* returns positive delay if it fires * /
    virtual void PrintStatus(ostream& o);  /* print status on o * /
    virtual void PrintStats(ostream& o);   /* print statistics * /
    static void TestMullerCC(ostream& o);  /* the test program * /
  static VerboseCode mullercc Verbosity;
  virtual VerboseCode GetMyVerbosity( ){return mullerccVerbosity:}
  //char* GetVerbID( ){return "MullerCC";}
  char* GetVerbID( ){return myName;}
    private:
      char* myName;
      TIME TimeA;
      TIME TimeB;
      TIME WaitTimeA;    /* statistics gathering * /
      TIME WaitTimeB;    /* statistics gathering * /
      int NumFirings;    /* number of times it's fired * /
      int isBstraight;                /* if False, B was initialized to be a bubble input * /
      DELAY FireIt( );   /* common part of the dings * /
}; /* end of MullerCC * /
#endif MULLERCC_H
/* @(#)mullercc.C        1.1        revised 11/22/94 * /
/* mullercc.C This is the header file for the MullerCC class * /
/* Ivan Sutherland 18 September 1994 * /
/* related files:
mullercc.h
*/
#include <iostream.h>
#include <string.h>
#include "mullercc.h"
#include "event.h"
VerboseCode MullerCC::mullerccVerbosity = NO_TRACE;
/* ---------- constructor ---------- * /
MullerCC::
MullerCC(int TF)                                                          Muller CC
{
  myName = "unnamed MullerC";
  isBstraight=TF;
```

```
        MasterClear(isBstraight);
}   /* end of MullerCC constructor */
MullerCC::
MullerCC(char* name, int TF)                                                MullerCC
{
    myName = strdup(name);
    isBstraight= TF;
    MasterClear(isBstraight);
}   /* end of MullerCC constructor */
void MullerCC::
MasterClear(int TF)                                                         MasterClear
{
    TimeA = TimeB = -1;
    WaitTimeA = WaitTimeB = 0;
    NumFirings = 0;
    if (TF == False || isBstraight == False) DingB(0);    /* set bubble on input B */
}/* end of MasterClear */
DELAY MullerCC::
DingA(DELAY d)                                                              DingA
{
    DELAY dout;           /* delay required to represent my event */
    if (TimeA < 0) TimeA = Event::GetTime(d);
    else {Error("double ding A: second ding ignored"); return -2;};
    if (TimeB < 0) return -1;             /* not yet ready */
/* the Muller C element fires */
    dout = FireIt( );
    return dout;
}/* end of DingA */
DELAY MullerCC::
DingB(DELAY d)                                                              DingB
{
    DELAY dout;           /* delay required to represent my event */
    if (TimeB < 0) TimeB = Event::GetTime(d);
    else {Error("double ding B: second ding ignored"); return -2;}
    if (TimeA < 0) return -1;             /* not yet ready */
/* the Muller C element fires */
    dout = FireIt( );
    return dout;
}/* end of DingA */
DELAY MullerCC::                                                            FireIt
FireIt( )
{
    DELAY d;
    TIME tdif = TimeA - TimeB;      /* difference in arival times */
    NumFirings ++;
    if (tdif > 0)
        {/* A is later */
        d = Event::GetDelay(TimeA);   /* represent A at A's time */
        WaitTimeB = WaitTimeB + tdif;
        }
    else
        {/* B is later */
        d = Event::GetDelay(TimeB);   /* represent B at A's time */
        WaitTimeA = WaitTimeA - tdif;  /* tdif < 0 */
        }
    TimeA = TimeB = -1;
    return d;
}/* end of FireIt */
void MullerCC::                                                             PrintStatus
PrintStatus(ostream& o)
{
    PrintStats(o);
    o <<" waiting for: ";
    if (TimeA < 0 && TimeB < 0) o << "both";
    else if (TimeA < 0) o << "A";
    else if (TimeB < 0) o << "B";
    else if (TimeA >= 0 && TimeB >= 0) o << "neither";
    o << " at TIME " << Event::GetTime(0) << endl << endl;
} * end of PrintStatus */
void MullerCC::
PrintStats(ostream& o)                                                      PrintStats
{
    o << "Statistics for MullerCC:" << myName << " NumFirings = " << NumFirings << endl;
    o << " WaitTimeA = " << WaitTimeA << " WaitTimeB = " <<WaitTimeB << endl;
    o << " TimeA = " << TimeA << " TimeB = "<< TimeB << endl;
}/* end of PrintStats */
/* ---------- the test program ----------- */
void MullerCC::
TestMullerCC(ostream& o)                                                    TestMullerCC
{
```

```
            DELAY d;
            o << "TEST PROGRAM FOR MullerCC" << endl;
            MullerCC* X = new MullerCC("MulX");
            MullerCC* Y = new MullerCC("MulY" False);
            o << "Built two MullerCCs" << endl;
    /* test equal input times */
            o << endl << "----- test equal input times" << endl;
            X-> MasterClear(True);
            X-> PrintStatus(o);
            d= X-> DingA(5);
            if (d != -1) o << "===== wrong return X1" << endl;
            X-> PrintStatus(o);
            d= X-> DingB(5);
            if (d != -5) o << "===== wrong return X2" << endl;
            X-> PrintStatus(o);
            d= X-> DingB(10);
            if (d != -1) o << "===== wrong return X3" << endl;
            X-> PrintStatus(o);
            d= X-> DingA(10);
            if (d != 10) o << "===== wrong return X4" << endl;
            X-> PrintStatus(o);
    /* test unequal input times */
            o << endl << "----- test unequal input times" << endl;
            X-> MasterClear(True);
            X-> PrintStatus(o);
            d= X-> DingB(50);
            if (d != -1) o << "===== wrong return X5" << endl;
            X-> PrintStatus(o);
            d= X-> DingA(40);
            if (d != 50) o << "===== wrong return X6" << endl;
            X-> PrintStatus(o);
            d= X-> DingA(80);
            if (d != -1) o << "===== wrong return X7" << endl;
            X-> PrintStatus(o);
            d= X-> DingB(60);
            if (d != 80) o << "===== wrong return X8" << endl;
            X-> PrintStatus(o);
    /* test double dings */
            o << endl << "----- test double dings" << endl;
            X-> MasterClear(True);
            X-> PrintStatus(o);
            d= X-> DingA(100);
            if (d != -1) o << "===== wrong return dda1" << endl;
            X-> PrintStatus(o);
            d= X-> DingA(200);
            if (d != -2) o << "===== wrong return dda2" << endl;
            X-> PrintStatus(o);
            d= X-> DingB(300);
            if (d != 300) o << "===== wrong return dda3" << endl;
            X-> PrintStatus(o);
            X-> MasterClear(True);
            X-> PrintStatus(o);
            d= X-> DingB(500);
            if (d != -1) o << "===== wrong return ddb1" << endl;
            X-> PrintStatus(o);
            d= X-> DingB(600);
            if (d != -2) o << "===== wrong return ddb2" << endl;
            X-> PrintStatus(o);
            d= X-> DingA(700);
            if (d != 700) o << "===== wrong return ddb3" << endl;
            X-> PrintStatus(o);
    /* test False input form */
            o << endl << "----- test False input form" << endl;
            X-> MasterClear(False);
            X-> PrintStatus(o);
            d= X-> DingA(100);
            if (d != 100) o << "===== wrong return ffx1" << endl;
            X-> PrintStatus(o);
            d= X-> DingA(200);
            if (d != -1) o << "===== wrong return ffx2" << endl;
            X-> PrintStatus(o);
            d= X-> DingB(300);
            if (d != 300) o << "===== wrong return ffx3" << endl;
            X-> PrintStatus(o);
            X-> MasterClear(False);
            X-> PrintStatus(o);
            d= X-> DingB(500);
            if (d != -2) o << "===== wrong return ffy1" << endl;
            X-> PrintStatus(o);
            d= X-> DingB(600);
```

-continued

```
        if (d != -2) o << "==== wrong return ffy2" << endl;
        X-> PrintStatus(o);
        d= X-> DingA(700);
        if (d != 700) o << "==== wrong return ffy3" << endl;
        X-> PrintStatus(o);
/* test permanent False input form */
        o << endl << "---- test False input form" << endl;
        Y-> MasterClear( );
        Y-> PrintStatus( );
        d= Y-> DingA(100);
        if (d != 100) o << "==== wrong return john" << endl;
        Y-> PrintStatus(o);
        d= Y-> DingA(200);
        if (d != -1) o << "==== wrong return mary" << endl;
        Y-> PrintStatus(o);
        d= Y-> DingB(400);
        if (d != 400) o << "==== wrong return top" << endl;
        o << "====End of MullerCC test" << endl << endl;
}/* end of TestMullerCC */
/* this the end of mullerCC.C */
```

What is claimed is:

1. A method for simulating behavior of a system comprising:

providing a representation of the system to be simulated, the system including a plurality of interconnected first elements, paths, and second elements;

determining the behavior of a first portion of the system not including a first element by calculating parameters relating to the first portion, the parameters including the simulated time of arrival of an event at the first element;

determining the behavior of a second portion of the system not including the first element by calculating parameters relating to the second portion, the parameters including the simulated time of a arrival of a second event at the first element; and wherein the simulated time of arrival of the first event is calculated before the simulated time of arrival of the second event and wherein the simulated time of arrival of the second event is prior to the simulated time of arrival of the first event.

2. A method for simulating behavior of a system as in claim 1 wherein the system comprises an electrical circuit design.

3. A method for simulating behavior of an electrical circuit design as in claim 2 further comprising dividing the electrical circuit design to be simulated into a series of events and paths interrelating those events, and wherein the steps of determining the electrical behavior of a first portion of the circuit and determining the electrical behavior of a second portion of the circuit comprise dividing the circuit into portions which either begin with an output node of a delay insensitive circuit or end with an input node to a delay insensitive circuit.

4. A method for simulating behavior of an electrical circuit design as in claim 3 further comprising the steps of:

dividing the representation of the electrical circuit design to be simulated into a series of smaller circuit designs, each smaller circuit design beginning at an output of a delay insensitive element and ending at an input of a delay insensitive element, and including identification of a next element to be simulated;

compiling each smaller circuit design into a procedure beginning at a simulated starting time and ending at a simulated completion time; and placing the identification of the next element to be simulated in an event queue for simulation.

5. A method for simulating behavior of an electrical circuit design as in claim 3 further comprising:

determining the electrical behavior of a third portion of the circuit following the first delay insensitive element, but not including the first delay insensitive element, by calculating electrical parameters relating to the third portion of the circuit following the first delay insensitive element, the electrical parameters including the simulated time of arrival of a third signal at a second delay insensitive element; and determining the simulated times of arrival of the first and the second signals and using the last to arrive of these signals to generate the output signal.

6. A method for simulating behavior of an electrical circuit design as in claim 2 wherein the first delay insensitive element is characterized as providing an output signal upon receipt of the latter of the simulated time of arrival of the first signal and the second signal.

7. A method for simulating behavior of an event driven electrical circuit design comprising:

providing a representation of an electrical circuit design to be simulated, the circuit design including a plurality of interconnected first elements responsive to events, circuit paths, and circuit elements;

determining the electrical behavior of a first portion of the circuit not including a first element by calculating event parameters relating to the first portion of the circuit prior to the first element, the event parameters including the simulated time of arrival of a first event at the first element;

determining the electrical behavior of a second portion of the circuit not including the first element by calculating event parameters relating to the second portion of the circuit prior to the first element, the electrical parameters including the simulated time of arrival of a second event at the first element; and wherein the simulated time of arrival of the first event is calculated before the simulated time of arrival of the second event and wherein the simulated time of arrival of the second event is prior to the simulated time of arrival of the first event.

8. A method for simulating behavior of an electrical circuit design comprising:

providing a representation of an electrical circuit design to be simulated, the circuit design including a plurality of interconnected first elements, circuit paths, and circuit elements;

determining the electrical behavior of a first portion of the circuit not including a first element by calculating electrical parameters relating to the first portion of the circuit prior to the first element, the electrical parameters including the simulated time of arrival of a first signal at the first element;

determining the electrical behavior of a second portion of the circuit not including the first element by calculating electrical parameters relating to the second portion of the circuit prior to the first element, the electrical parameters including the simulated time of arrival of second signal at the first element; and wherein the simulated time of arrival of the first signal is calculated before the simulated time of arrival of the second signal and wherein the simulated time of arrival of the second signal is prior to the simulated time of arrival of the first signal.

* * * * *